United States Patent
Chew et al.

(10) Patent No.: US 8,664,079 B2
(45) Date of Patent: Mar. 4, 2014

(54) METHOD OF FABRICATING SEMICONDUCTOR DEVICE BY THINNING HARDMASK LAYERS ON FRONTSIDE AND BACKSIDE OF SUBSTRATE

(75) Inventors: Han-Guan Chew, Singapore (SG); Ming Zhu, Singapore (SG); Lee-Wee Teo, Singapore (SG); Harry-Hak-Lay Chuang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 43 days.

(21) Appl. No.: 13/316,817

(22) Filed: Dec. 12, 2011

(65) Prior Publication Data

US 2012/0083095 A1    Apr. 5, 2012

Related U.S. Application Data

(62) Division of application No. 12/706,782, filed on Feb. 17, 2010, now Pat. No. 8,143,137.

(51) Int. Cl.
*H01L 21/76* (2006.01)

(52) U.S. Cl.
USPC ............ 438/424; 438/699; 438/702; 257/640

(58) Field of Classification Search
USPC ......... 438/424, 425, 426, 697, 699, 700, 702, 438/977, 429, 443, 703, 761, 118, 694; 257/632, 635, 639, 640

See application file for complete search history.

(56) References Cited

U.S. PATENT DOCUMENTS

| | | | |
|---|---|---|---|
| 2004/0126990 A1* | 7/2004 | Ohta | 438/435 |
| 2006/0148199 A1* | 7/2006 | Kim | 438/424 |
| 2006/0178004 A1 | 8/2006 | Cotte et al. | |
| 2009/0032935 A1* | 2/2009 | Bhowmik et al. | 257/701 |

OTHER PUBLICATIONS

Chinese Application No. 2012052200795520 which corresponds to U.S. Appl. No. 13/316,817.

* cited by examiner

*Primary Examiner* — Thanh Y Tran

(74) *Attorney, Agent, or Firm* — Lowe Hauptman & Ham, LLP

(57) ABSTRACT

The disclosure relates to integrated circuit fabrication, and more particularly to a method for fabricating a semiconductor device. An exemplary method for fabricating the semiconductor device comprises providing a substrate; forming pad oxide layers over a frontside and a backside of the substrate; forming hardmask layers over the pad oxide layers on the frontside and the backside of the substrate; and thinning the hardmask layer over the pad oxide layer on the frontside of the substrate.

10 Claims, 21 Drawing Sheets

__US 8,664,079 B2__

METHOD OF FABRICATING SEMICONDUCTOR DEVICE BY THINNING HARDMASK LAYERS ON FRONTSIDE AND BACKSIDE OF SUBSTRATE

CROSS-REFERENCES TO RELATED APPLICATIONS

The present application is a divisional of and claims the benefit of U.S. patent application Ser. No. 12/706,782, filed Feb. 7, 2010.

TECHNICAL FIELD

The disclosure relates to integrated circuit fabrication, and more particularly to a method for fabricating a semiconductor device.

BACKGROUND

The semiconductor integrated circuit (IC) industry has experienced rapid growth. Technological advances in IC materials and design have produced generations of IC technology, where each generation has smaller and more complex circuits than the previous generation. However, these advances have increased the complexity of processing and manufacturing ICs and, for these advances to be realized, up-to-date developments in IC processing and manufacturing are needed.

FIGS. 1A-C show cross-sectional views of a substrate 102 comprising a frontside 102a and a backside 102b at various stages of fabricating a semiconductor device in a conventional process. FIG. 1A illustrates the structure produced by a conventional isolation fabrication technique that comprises: forming pad oxide layers 112a, 112b over the frontside 102a and the backside 102b of the substrate 102; forming hardmask layers 114a, 114b comprising materials such as silicon nitride over the pad oxide layers 112a, 112b on the frontside 102a and the backside 102b of the substrate 102; forming an opening 122 through the hardmask layer 114a and the pad oxide layer 112a in the frontside 102a of the substrate 102; performing anisotropic etching through the opening 122 to form a trench 124 in the frontside 102a of the substrate 102; filling the trench 124 with a dielectric layer 126 that extends beyond the trench 124 to cover entire surface of the hardmask layer 114a; and performing a chemical mechanical polishing (CMP) to remove the top portion of the dielectric layer 126 above the hardmask layer 114a to expose the hardmask layer 114a on the frontside 102a of the substrate 102, thereby leaving the dielectric layer 126 filling the opening 122 and trench 124.

However, problems arise when subsequently removing the hardmask layer 114a and the pad oxide layer 112a to expose the frontside 102a of the substrate 102, producing the structure shown in FIG. 1C. The hardmask layers 114a, 114b and the pad oxide layers 112a, 112b are removed by two separate wet etching steps. During the first wet etching step using phosphoric acid ($H_3PO_4$), the hardmask layers 114a, 114b on the frontside 102a and the backside 102b of the substrate 102 are simultaneously removed, leaving the pad oxide layers 112a, 112b on the frontside 102a and the backside 102b of the substrate 102 as shown in FIG. 1B. Then, a second wet etching step using hydrofluoric (HF) acid simultaneously remove the pad oxide layers 112a, 112b on the frontside 102a and the backside 102b of the substrate 102 to expose portions of the substrate 102 on the frontside 102a and the backside 102b as shown in FIG. 1C.

In some configurations, the exposed portions of the backside 102b of the substrate 102 may provide carrier transportation paths during subsequent plasma-related processes thereby increasing the likelihood of device instability and/or device failure. Accordingly, what is needed is a method for fabricating a semiconductor device having dielectric films on the backside of the substrate from early stage of the device formation.

BRIEF DESCRIPTION OF THE DRAWINGS

The present disclosure is best understood from the following detailed description when read with the accompanying figures. It is emphasized that, in accordance with the practice in the industry, various features are not drawn to scale and are used for illustration purposes only. In fact, the dimensions of the various features may be arbitrarily increased or reduced for clarity of discussion.

DESCRIPTION

Figure 1A:
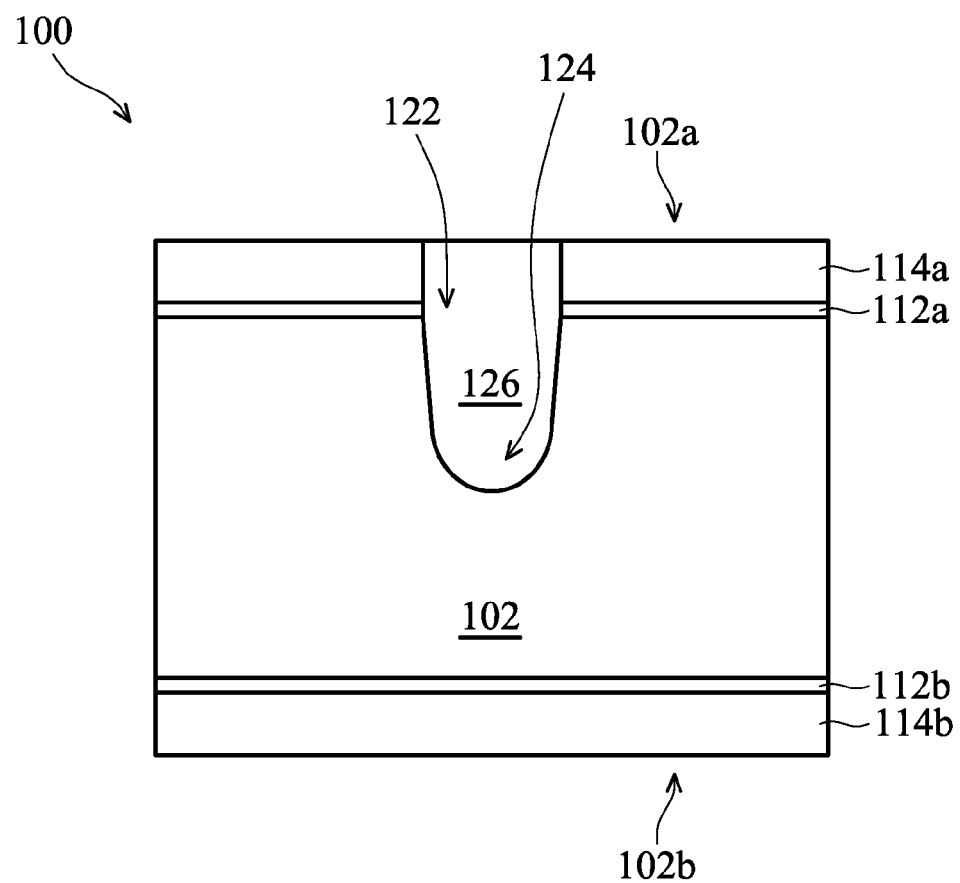
FIGS. 1A-C show cross-sectional views of a substrate comprising a frontside and a backside at various stages of fabricating a semiconductor device in a conventional process.
Figure 1B:
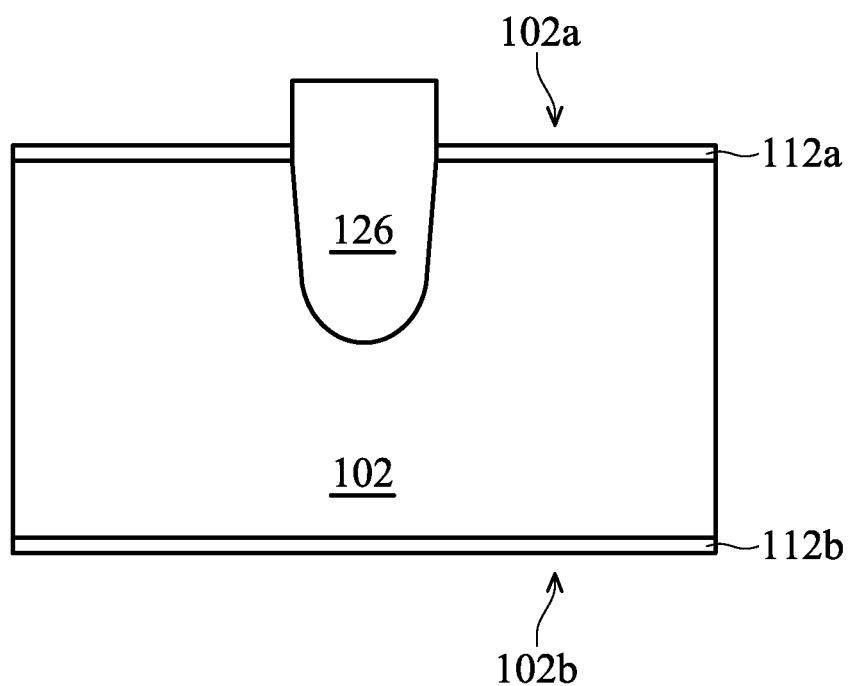
Figure 1C:
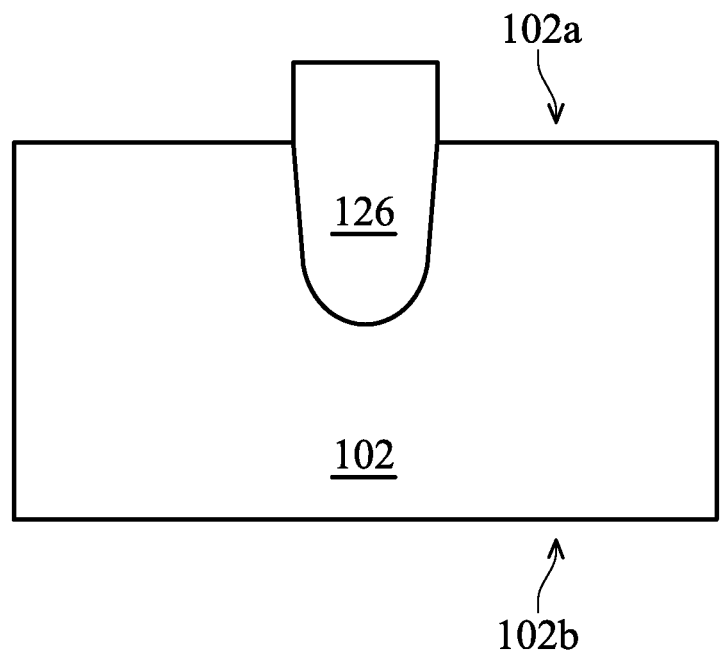

It is understood that the following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
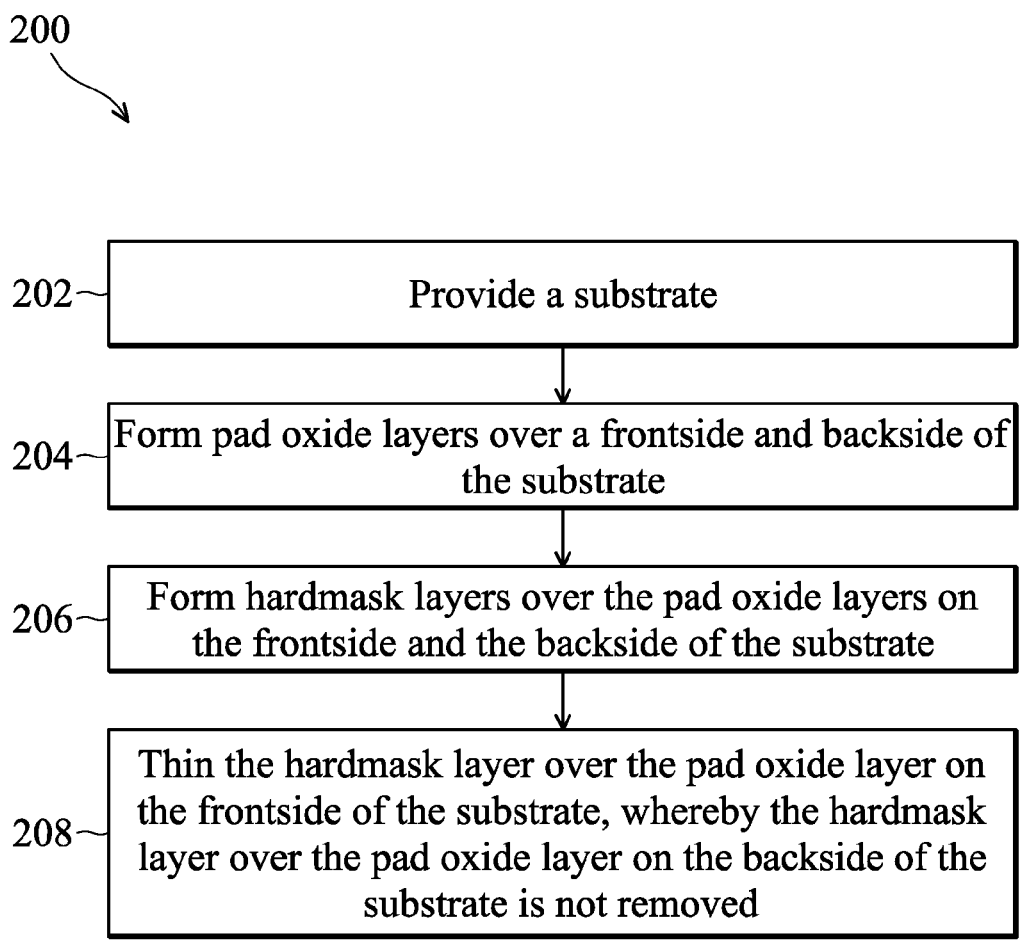
FIG. 2 is a flowchart illustrating a method for fabricating a semiconductor device according to various aspects of the present disclosure.

Referring to FIG. 2, illustrated is a flowchart of a method 200 for fabricating a semiconductor device according to various aspects of the present disclosure. The method 200 begins with block 202 in which a substrate is provided. The method 200 continues with block 204 in which pad oxide layers may be formed over a frontside and a backside of the substrate. The method 200 continues with block 206 in which hardmask layers may be formed over the pad oxide layers on the frontside and the backside of the substrate. The method 200 continues with block 208 in which the hardmask layer over the pad oxide layer on the frontside of the substrate may be thinned, whereby the hardmask layer over the pad oxide layer on the backside of the substrate is not removed. The discussion that follows illustrates an embodiment of a semiconductor device that can be fabricated according to the method 200 of FIG. 2.

Figure 3A:
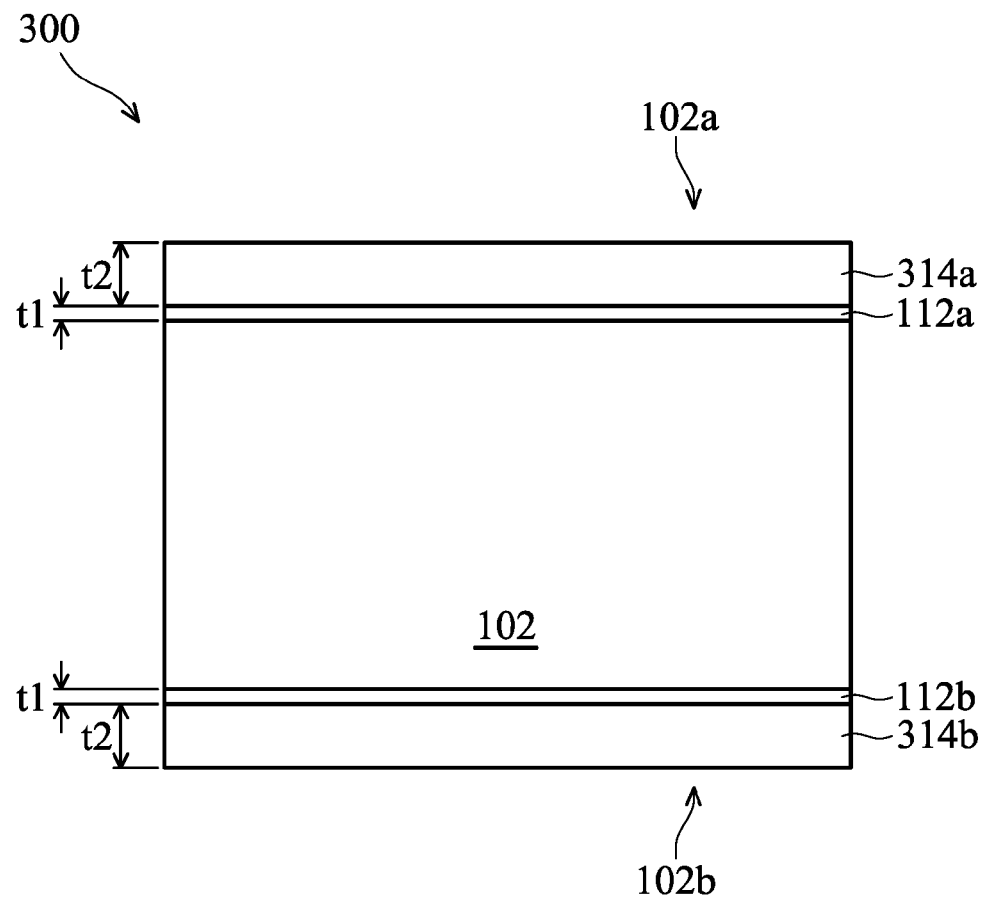
FIGS. 3A-G show cross-sectional views of a semiconductor device at various stages of fabrication according to an embodiment.
Figure 3B:
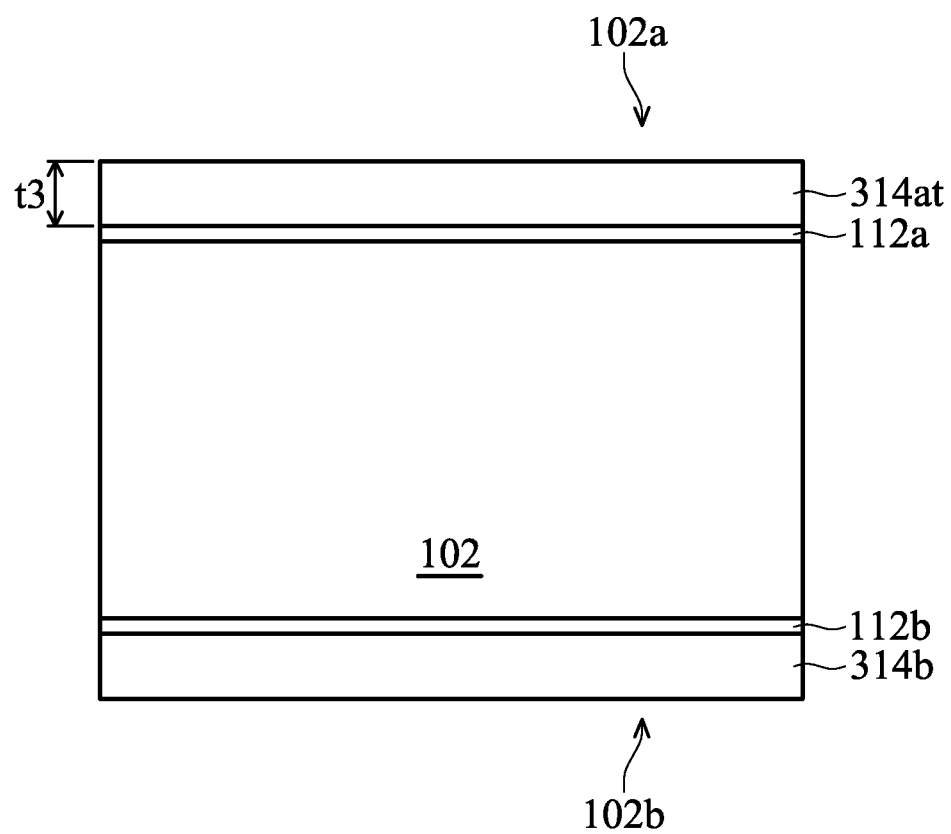
Figure 3C:
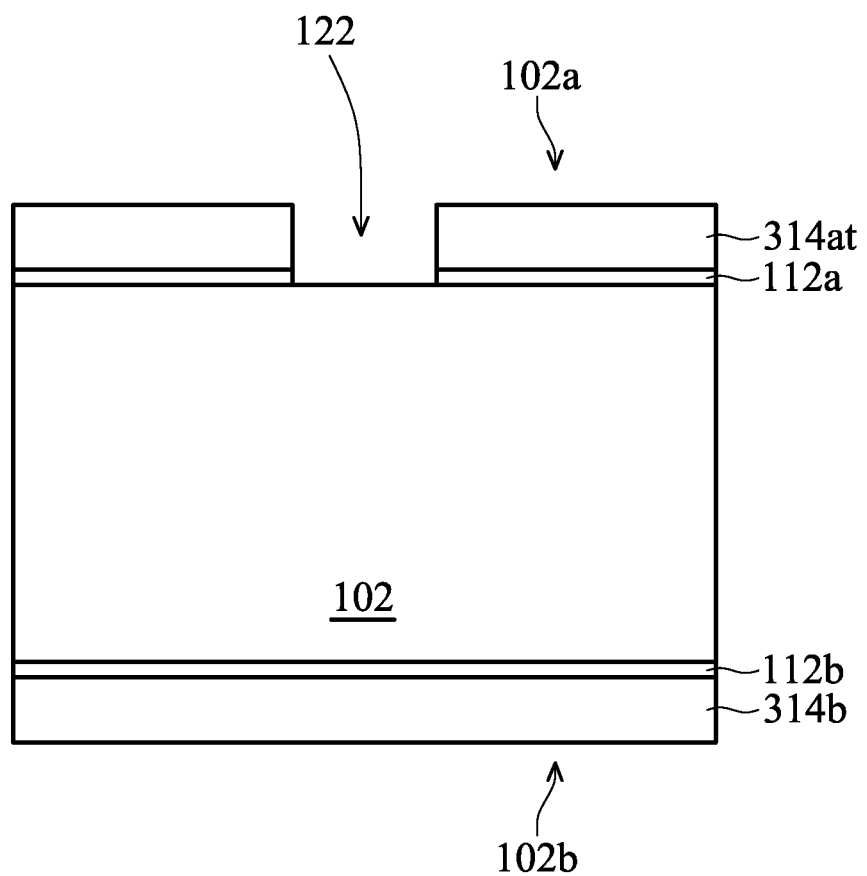
Figure 3D:
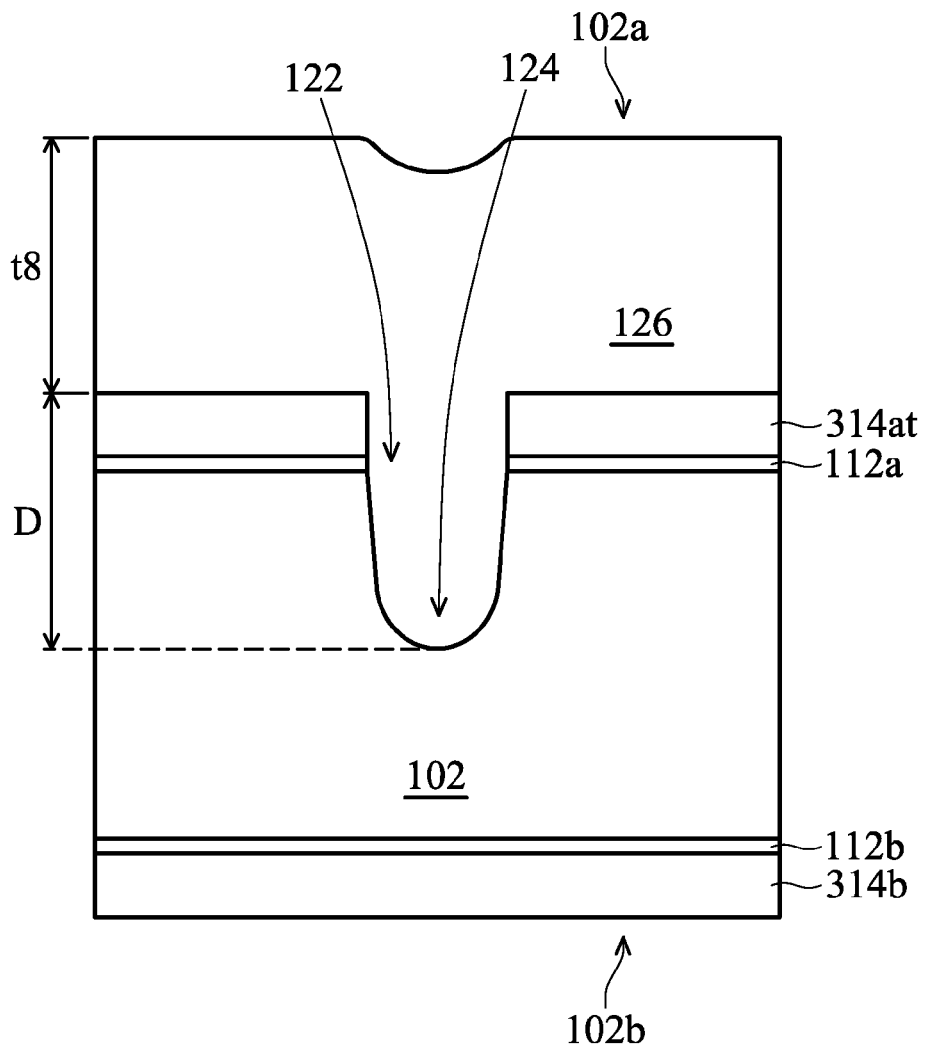
Figure 3E:
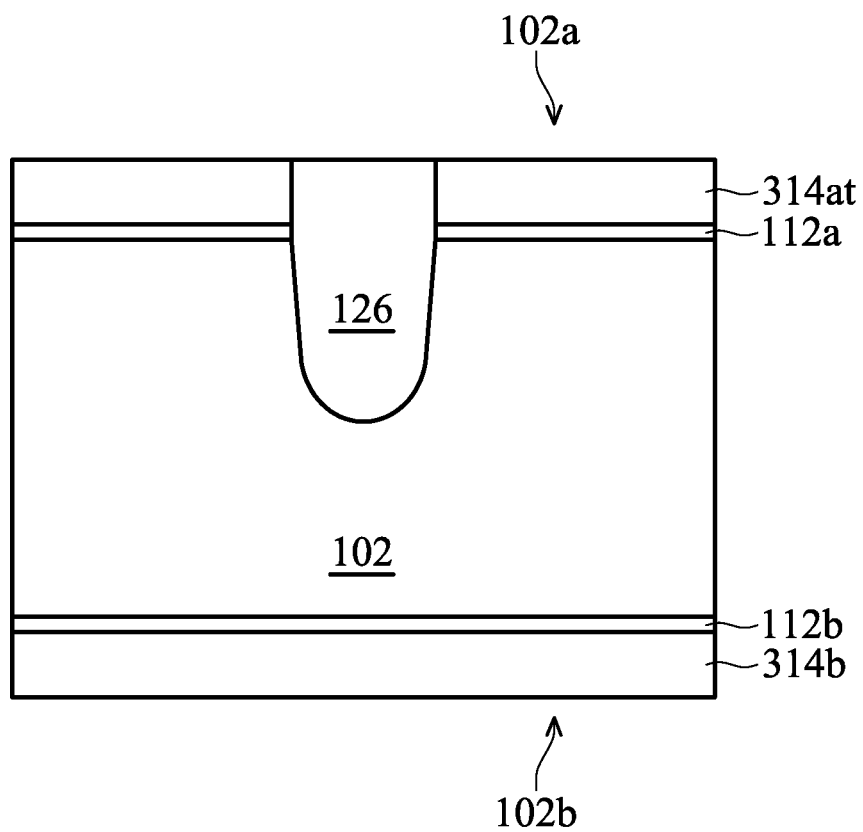
Figure 3F:
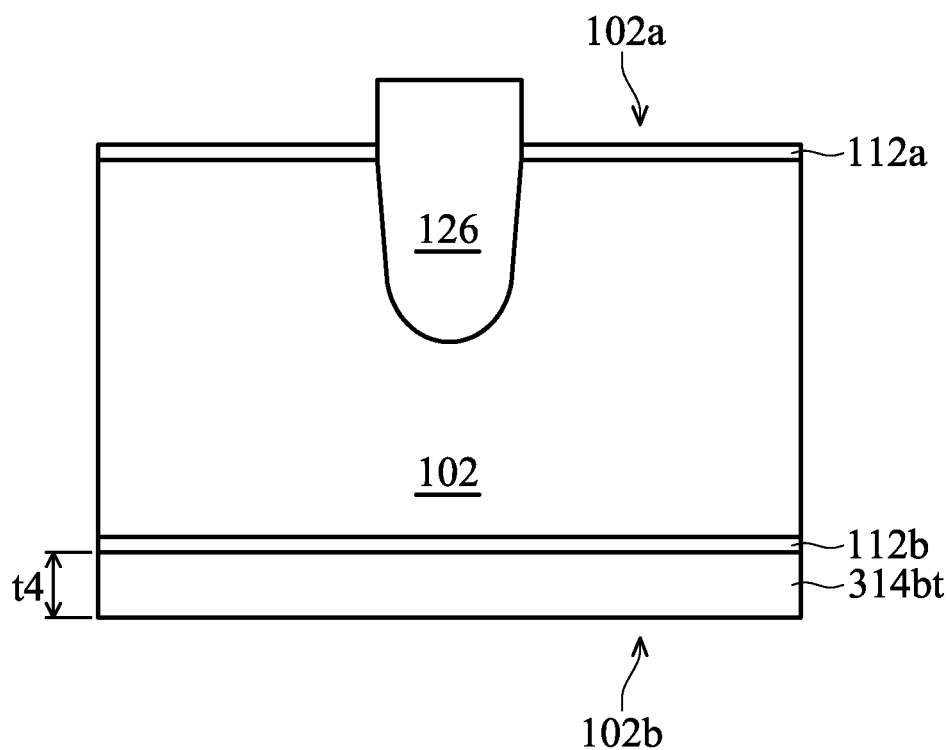
Figure 3G:
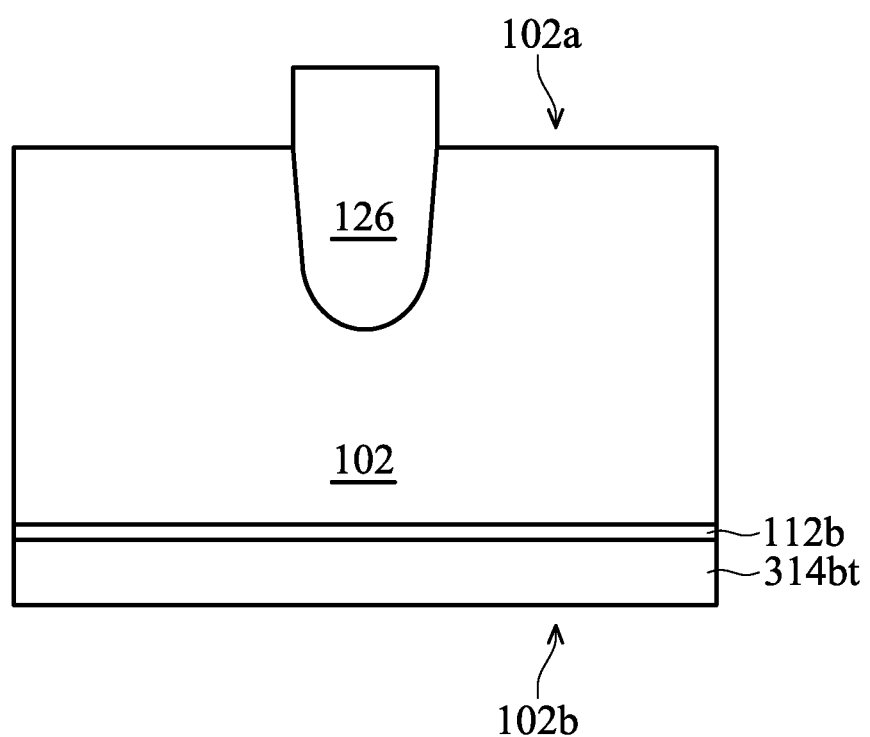

Referring to FIGS. 3A-3G, illustrated are cross-sectional views of a semiconductor device 300 at various stages of fabrication according to the embodiment of FIG. 2. It is noted that the example method 200 of FIG. 2 does not produce a completed semiconductor device 300. In some embodiments, the completed semiconductor device 300 may be fabricated using complementary metal-oxide-semiconductor (CMOS) technology processing. Accordingly, it is understood that additional processes may be provided before, during, and after the method 200 of FIG. 2, and that some other processes may only be briefly described herein. Also, FIGS. 2 through 3G are simplified for a better understanding of the embodiments of the present disclosure. For example, although the figures illustrate a portion of the semiconductor device 300, it is understood that the device 300 may comprise other components, and the IC containing the device 300 may comprise a number of other devices comprising resistors, capacitors, inductors, fuses, etc.

Referring to FIG. 3A, a substrate 102 is provided. In some embodiments, the substrate 102 may comprise a silicon substrate. In other embodiments, the substrate 102 may comprise silicon germanium, gallium arsenic, or other suitable semiconductor materials. The substrate 102 may further comprise other features such as various doped regions, a buried layer, and/or an epitaxy layer. Furthermore, in some embodiments, the substrate 102 may be a semiconductor on insulator such as silicon on insulator (SOI). In other embodiments, the substrate 102 may comprise a doped epi layer, a gradient semiconductor layer, and/or may further include a semiconductor layer overlying another semiconductor layer of a different type such as a silicon layer on a silicon germanium layer. In other examples, the semiconductor substrate 102 may comprise a multilayer structure comprising silicon and a compound semiconductor or a multilayer structure comprising silicon and a plurality of compound semiconductor layers.

Still referring to FIG. 3A, pad oxide layers 112a, 112b may be formed over a frontside 102a and a backside 102b of the substrate 102. The pad oxide layers 112a, 112b may be formed of silicon oxide grown by a thermal oxidation process. For example, in some embodiments, the pad oxide layers 112a, 112b can be grown by the rapid thermal oxidation (RTO) process or in a conventional annealing process, which includes oxygen. In some embodiments, a thickness t1 of the pad oxide layers 112a, 112b may be in the range of about 80 to 100 angstroms. Hardmask layers 314a, 314b, for example a silicon nitride, may be formed over the pad oxide layers 112a, 112b on the frontside 102a and the backside 102b of the substrate 102. In some embodiments, the hardmask layers 314a, 314b can be deposited by, for example, a low pressure CVD (LPCVD) process. In some embodiments, a thickness t2 of the hardmask layers may be in the range of about 1200 to 1800 angstroms.

Referring to FIG. 3B, the hardmask layer 314a over the pad oxide layer 112a on the frontside 102a of the substrate 102 may be thinned using a dry etching process. Because the substrate 102 is placed the backside 102b down on a wafer chuck, the hardmask layer 314b over the pad oxide layer 112b on the backside 102b of the substrate 102 is not removed due to protection provided by the wafer chuck. For example, the dry etching process may be performed under a source power of about 150 to 220 W, and a pressure of about 10 to 45 mTorr, using BP, $CH_2F_2$, $O_2$, He, and Ar as etching gases. In some embodiments, a remaining thickness t3 of the etched hardmask layer 314at may be in the range of about 700 to 900 angstroms.

Referring to FIG. 3C, after the hardmask layer 314a thinning process, a patterned photo-sensitive layer (not shown) is formed on the hardmask layer 314at over the pad oxide layer 112a on the frontside 102a of the substrate 102. A reactive ion etching (RIE) or a high density plasma (HDP) process may, for example, be used to anisotropically etch through the hardmask layer 314at and the pad oxide layer 112a to form an opening 122 in the hardmask layer 314at and the pad oxide layer 112a, exposing a portion of the substrate 102 on the frontside 102a.

Referring to FIG. 3D, following formation of the opening 122 in the hardmask layer 314at and the pad oxide layer 112a, the exposed portion of the substrate 102 on the frontside 102a is etched to form a trench 124 having a predetermined depth D between about 300 to 3000 angstroms in the substrate 102. In one embodiment, the trench 124 is etched to have sloped trench sidewalls, having an angle between about 80°~90° with respect to the front surface with rounded top and bottom rounded corners to minimize stress. Subsequently, the patterned photo-sensitive layer is stripped after the trench 124 formation.

Still referring to FIG. 3D, following formation of the trench 124, a substantially conformal liner layer (not shown) may be formed over the substrate 102, including along the walls of the trench 124. In some embodiments, the liner layer is a dielectric layer (e.g., an oxide layer, nitride layer, oxynitride layer or combination thereof) formed by a thermal oxidation process or CVD process. In one embodiment, the liner layer may have a thickness of about 30 to 200 angstroms. In some embodiments, the liner layer is provided for reducing damage on the surface of the trench 124 created by the opening-etch process as set forth above. In some embodiments, the liner layer is not used.

Still referring to FIG. 3D, following formation of the optional liner layer, a dielectric layer 126, filling the trench 124 and covering the entire frontside 102a of the substrate 102, is formed over the optional liner layer. In various embodiments, the dielectric layer 126 may comprise silicon oxide, silicon oxynitride, or silicon nitride. In some embodiments, the dielectric layer 126 is formed over the optional liner layer to a predetermined thickness to form the dielectric layer 126 within the opening 122 and the trench 124. For example, the dielectric layer 126 may be deposited to a thickness t8 of 4000 to 8000 Å. In one embodiment, the dielectric layer 126 may be deposited by one of high-density-plasma chemical vapor deposition (HDPCVD), sub-atmospheric chemical vapor deposition (SACVD), or spin-on deposition (SOD). In a particular embodiment, after deposition, an anneal process may be performed to increase the density of the dielectric layer 126.

FIG. 3E shows the substrate 102 of FIG. 3D after a planarization process, such as a chemical mechanical polishing (CMP) process, is performed to remove the portion of the dielectric layer 126 on the frontside 102a of the substrate 102 above the remaining hardmask layer 314at to expose the remaining hardmask layer 314at, thereby leaving the dielectric layer 126 in the trench 124 and the opening 122. The remaining hardmask layer 314*at* also serves as a stop layer for stopping the planarization process on the remaining hardmask layer 314*at*.

Referring to FIG. 3F, after the planarization process, the remaining hardmask layer 314*at* has been removed by a wet chemical etching process, for example, by dipping the substrate 102 in hot phosphoric acid ($H_3PO_4$) in a controlled etch time. The wet chemical etching process in the controlled etch time may fully remove the remaining hardmask layer 314*at* to expose a top surface of the pad oxide layer 112*a* on the frontside 102*a* of the substrate 102 and thin the hardmask layer 314*b* on the backside 102*b* of the substrate 102. Namely, removing the hardmask layer 314*at* on the frontside 102*a* while a portion of the hardmask layer 314*bt* on the backside 102*b* remains. In some embodiments, a remaining thickness t4 of the etched hardmask layer 314*bt* in the backside 102*b* of the substrate 102 may be in the range of about 700 to 900 angstroms. Because the wet chemical etching process has higher etch selectivity for nitride than to oxide, the etch process removes the hardmask layer 314*at* faster than the dielectric layer 126. Accordingly, the remaining silicon oxide layer 126 extends over a top surface of the pad oxide layer 112*a* on the frontside 102*a* of the substrate 102.

Referring to FIG. 3G, subsequent to the hardmask layer 314*at* removal process, the pad oxide layer 112*a* is removed by a wet etching process, for example, by dipping the substrate 102 in hydrofluoric acid (HF), exposing the top surface of the substrate 102. Because the wet chemical etching process has higher etch selectivity for oxide than to nitride, the etch process removes the pad oxide layer 112*a* faster than the remaining hardmask layer 314*bt*. Accordingly, the remaining hardmask layer 314*bt* may be kept in the backside 102*b* of the substrate 102. Accordingly, applicant's method of fabricating a semiconductor device 300 may reserve the remaining hardmask layer 314*bt* in the backside 102*b* of the substrate 102 to serve as carrier transportation stops during subsequent plasma-related processes and thereby protecting the semiconductor device 300.

Figure 4:
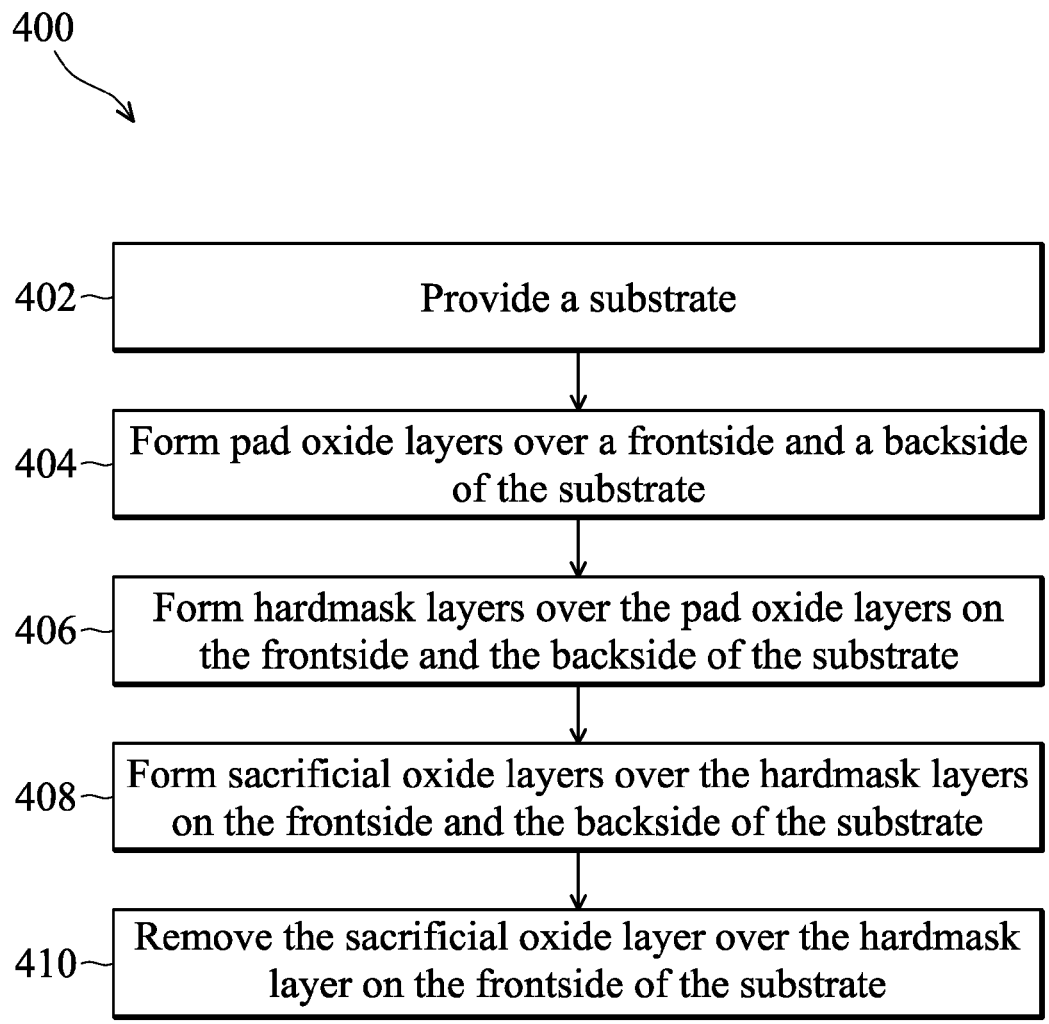
FIG. 4 is a flowchart illustrating a method for fabricating a semiconductor device according to various aspects of the present disclosure.

Referring to FIG. 4, illustrated is a flowchart of a method 400 for fabricating a semiconductor device according to another embodiment. The method 400 begins with block 402 in which a substrate is provided. The method 400 continues with block 404 in which pad oxide layers may be formed over a frontside and a backside of the substrate. The method 400 continues with block 406 in which hardmask layers may be formed over the pad oxide layers on the frontside and the backside of the substrate. The method 400 continues with block 408 in which sacrificial oxide layers may be formed over the hardmask layers on the frontside and the backside of the substrate. The method 400 continues with block 410 in which the sacrificial oxide layer over the hardmask layer on the frontside of the substrate may be removed. The discussion that follows illustrates an embodiment of a semiconductor device that can be fabricated according to the method 400 of FIG. 4.

Referring to FIGS. 5A-5E, illustrated are cross-sectional views of a portion of a semiconductor device 500 at various stages of fabrication according to the embodiment of FIG. 4. It is noted that the method 400 of FIG. 4 does not produce a completed semiconductor device. In some embodiments, a completed semiconductor device may be fabricated using complementary metal-oxide-semiconductor (CMOS) technology processing. Accordingly, it is understood that additional processes may be provided before, during, and after the method 400 of FIG. 4, and that some other processes may only be briefly described herein. Further, the portion of the semiconductor device 500 is similar to the portion of the semiconductor device 300 of FIG. 3. Accordingly, similar feature in FIGS. 3 and 5 are numbered the same for the sake of clarity and simplicity.

Figure 5A:
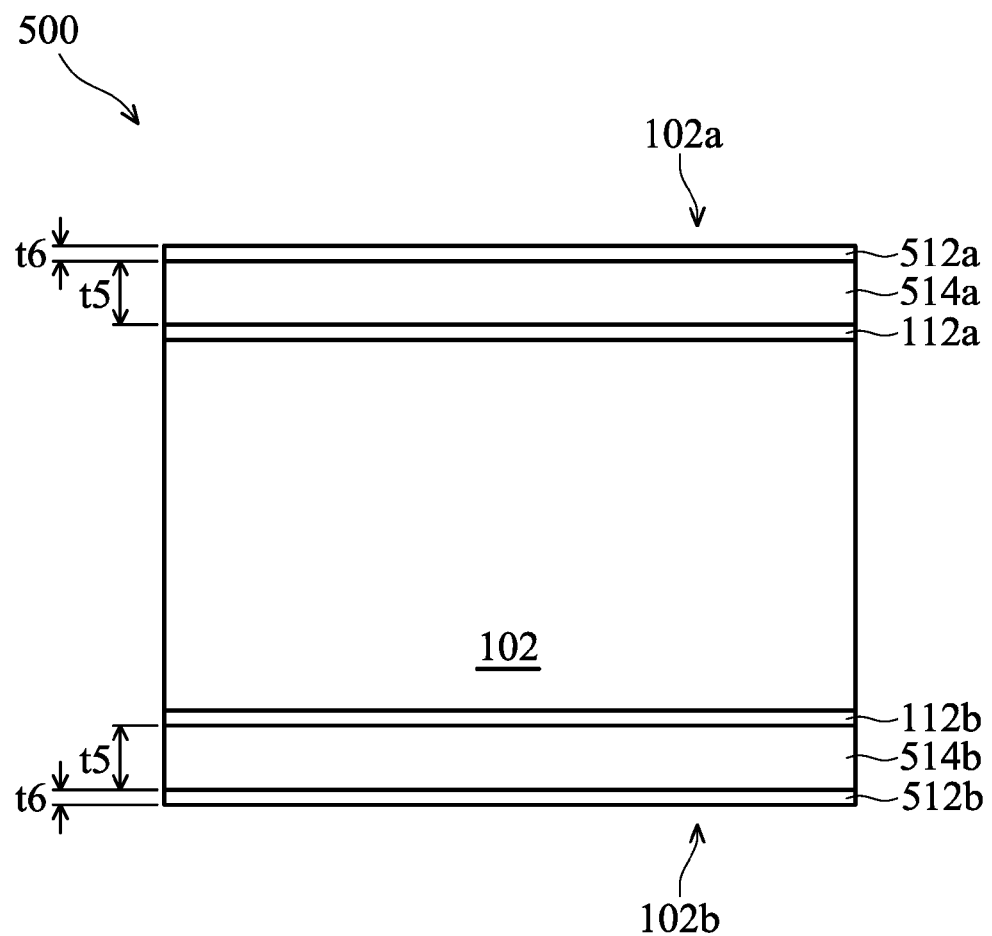
FIGS. 5A-E show cross-sectional views of a semiconductor device at various stages of fabrication according to an embodiment.

Referring to FIG. 5A, the portion of the semiconductor device 500 comprises a substrate 102 in some embodiments, the semiconductor device 500 may further comprise pad oxide layers 112*a*, 112*b* over a frontside 102*a* and a backside 102*b* of the substrate 102. Hardmask layers 514*a*, 514*b*, for example a silicon nitride, may be formed over the pad oxide layers 112*a*, 112*b* on the frontside 102*a* and the backside 102*b* of the substrate 102. In a particular embodiment, the hardmask layers 514*a*, 514*b* can be deposited by, for example, a low pressure CVD (LPCVD) process. In some embodiments, a thickness t5 of the hardmask layers may be in the range of about 700 to 900 angstroms.

Still referring to FIG. 5A, sacrificial oxide layers 512*a*, 512*b* are further formed over the hardmask layers 514*a*, 514*b* on the frontside 102*a* and the backside 102*b* of the substrate 102. The sacrificial oxide layers 512*a*, 512*b* can be deposited using a CVD process. For example, the sacrificial oxide layers 512*a*, 512*b* can be deposited under a pressure less than 10 mTorr and a temperature of about 350° C. to 500° C., using silane ($SiH_4$) and $N_2O$ as reacting precursors. The sacrificial oxide layers 512*a*, 512*b* may have any suitable thickness. In the present embodiment, a thickness t6 of the sacrificial oxide layers 512*a*, 512*b* may be in the range of about 80 to 100 angstroms.

Figure 5B:
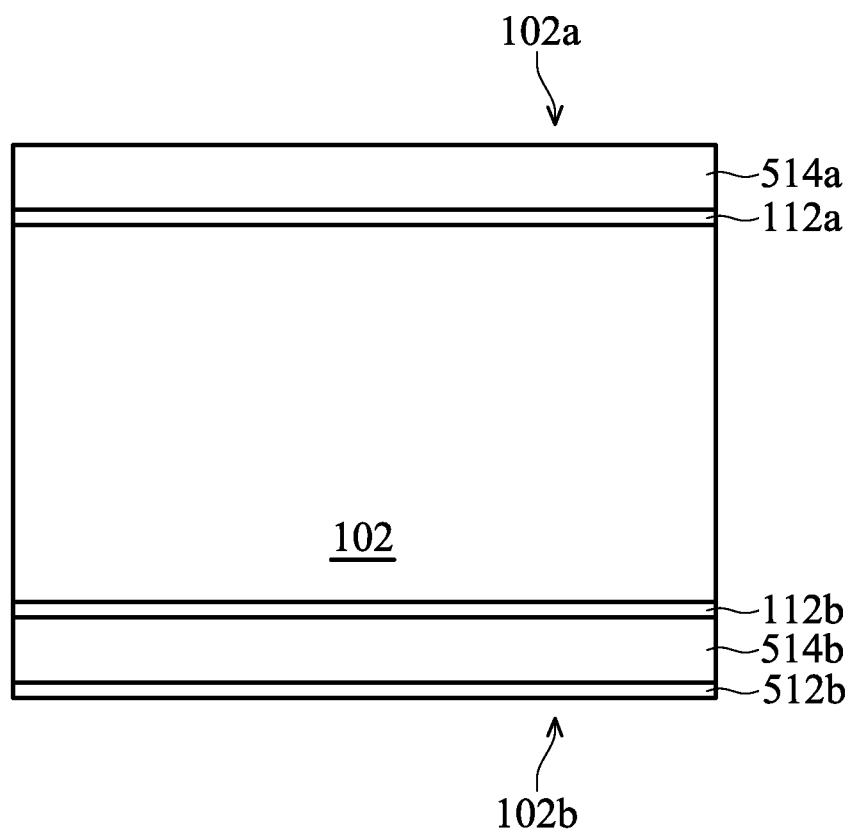

Referring to FIG. 5B, the sacrificial oxide layer 512*a* over the hardmask layer 514*a* on the frontside 102*a* of the substrate 102 may be removed using a dry etching process. Because the substrate 102 is placed the backside 102*b* down on a wafer chuck, a substantial portion of the sacrificial oxide layer 512*b* over the hardmask layer 514*b* on the backside 102*b* of the substrate 102 remains due to protection provided by the wafer chuck. For example, in some embodiments, the dry etching process may be performed under a source power of about 120 to 160 W, and a pressure of about 450 to 550 mTorr, using $BF_3$, $H_2$, and Ar as etching gases.

Figure 5C:
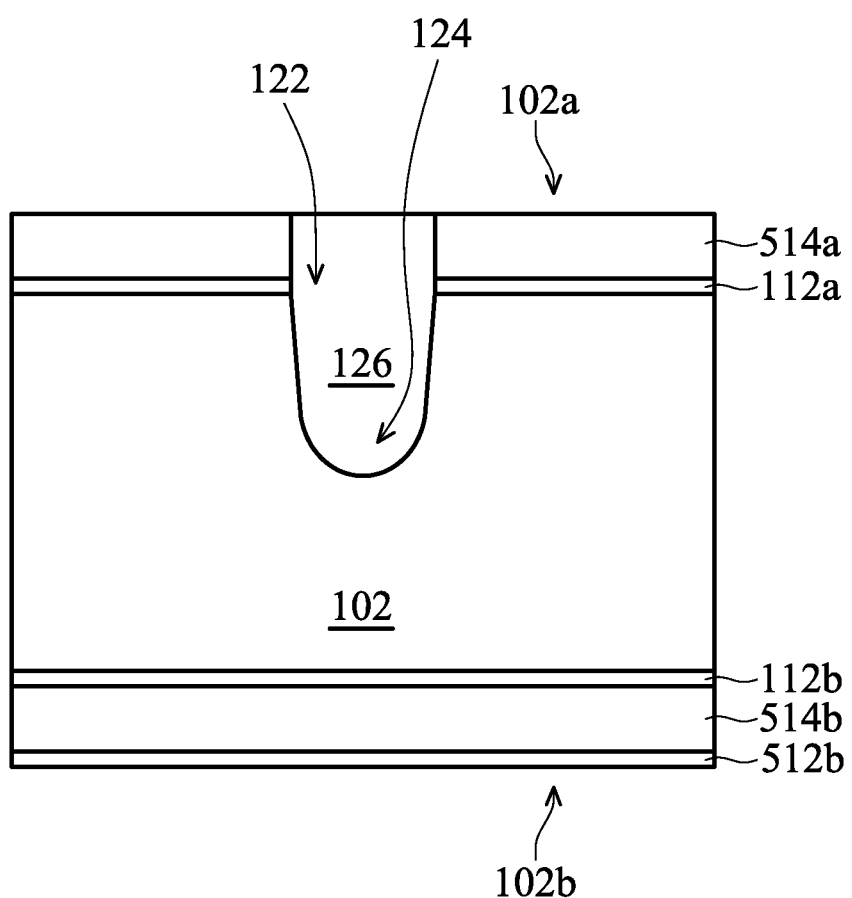

Referring to FIG. 5C, subsequent to the sacrificial oxide layer 512*a* removal process, the subsequent fabrication processes of the embodiment are substantially similar to the fabrication processes described with reference to FIGS. 3C-3E. Namely, forming an opening 122 through the hardmask layer 514*a* and the pad oxide layer 112*a* in the frontside 102*a* of the substrate 102; performing anisotropic etching to form a trench 124 in the substrate 102 on the frontside 102*a*; filling the trench 124 with a dielectric layer 126 that extends beyond the trench to cover the entire frontside 102*a* of the substrate 102; and performing a CMP to remove the portion of the dielectric layer 126 above the hardmask layer 514*a* to expose the hardmask layer 514*a* on the frontside 102*a* of the substrate 102, thereby leaving the dielectric layer 126 filling the opening 122 and trench 124.

Figure 5D:
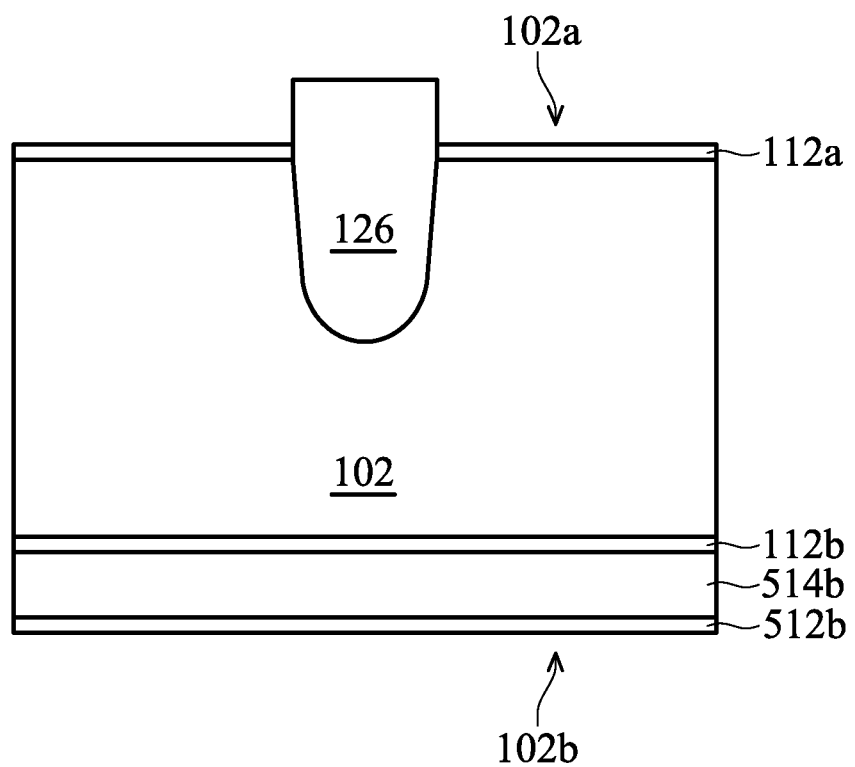

Referring to FIG. 5D, after the CMP process, the hardmask layer 514*a* has been removed by a wet chemical etching process, for example, by dipping the substrate 102 in hot phosphoric acid ($H_3PO_4$), exposing the top surface of the pad oxide layer 112*a* on the frontside 102*a* of the substrate 102. Because the wet chemical etching process has higher etch selectivity for nitride than to oxide, the etch process removes the hardmask layer 514*a* faster than the dielectric layer 126 and the sacrificial oxide layer 512*b* over the hardmask layer 514*b* on the backside 102*b* of the substrate 102. Accordingly, the silicon oxide layer 126 extends over a top surface of the pad oxide layer 112*a* on the frontside 102*a* of the substrate 102. Further, a substantial portion of the sacrificial oxide layer 512b over the hardmask layer 514b on the backside 102b of the substrate 102 remains.

Figure 5E:
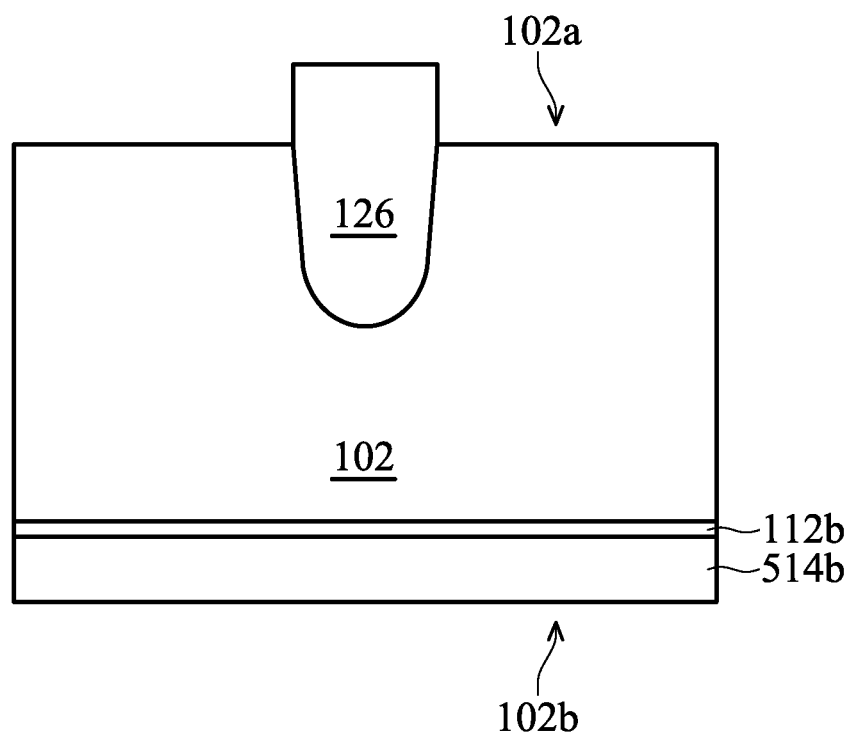

Referring to FIG. 5E, subsequent to the hardmask layer 514a removal process, the pad oxide layer 112a and sacrificial oxide layer 512b have been removed by a wet etching process simultaneously, for example, by dipping the substrate 102 in hydrofluoric acid (HF), exposing the top surface of the substrate 102. Additionally, because the wet chemical etching process has higher etch selectivity for oxide than to nitride, the etch process removes the pad oxide layer 112a and sacrificial oxide layer 512b faster than the hardmask layer 514b. Accordingly, the hardmask layer 514b may be kept in the backside 102b of the substrate 102. Accordingly, the embodiment of FIG. 4 for fabricating a semiconductor device 500 may reserve the hardmask layer 514b in the backside 102b of the substrate 102 to serve as carrier transportation stops during subsequent plasma-related processes thereby protecting the semiconductor device 500.

Figure 6:
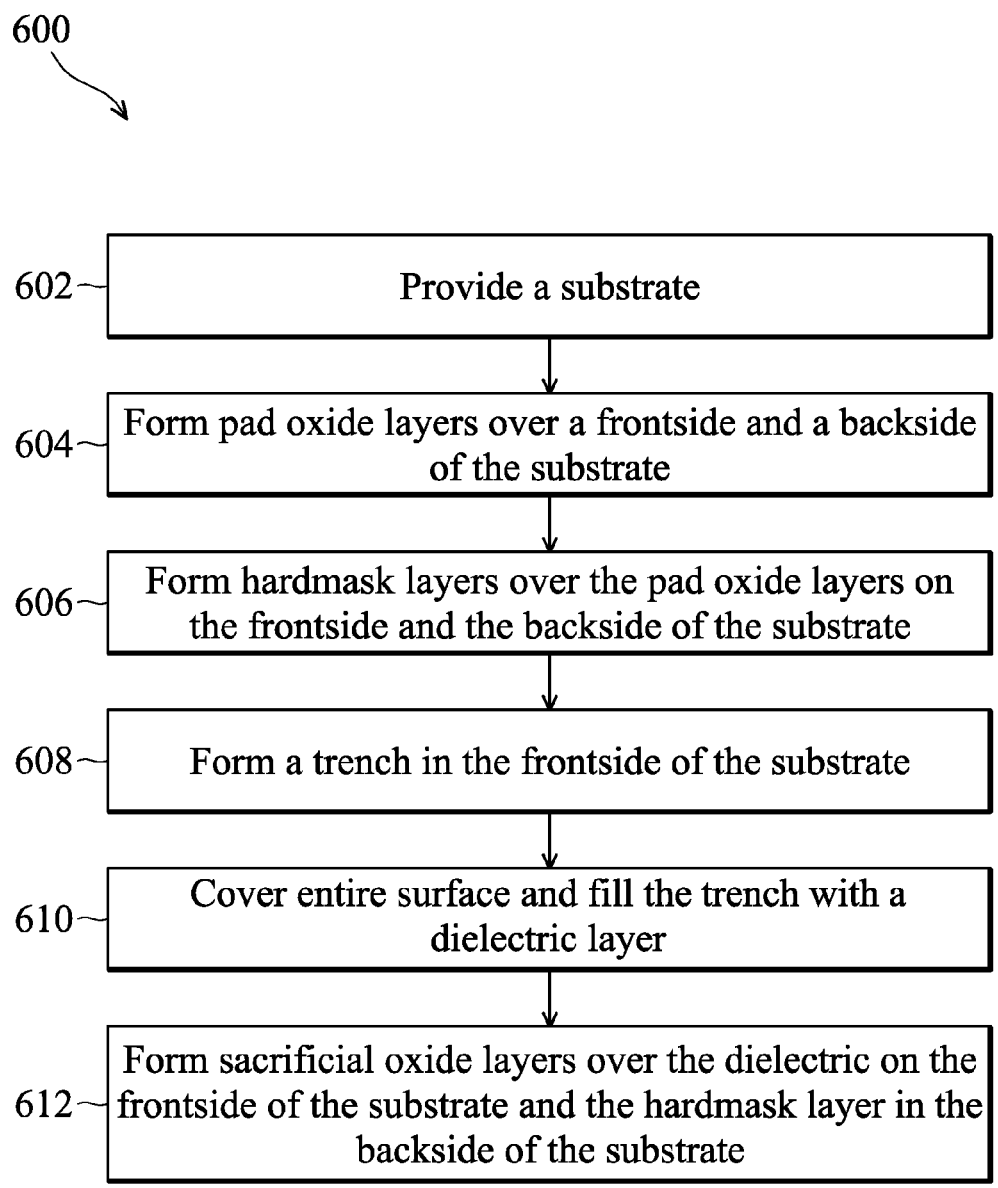
FIG. 6 is a flowchart illustrating a method for fabricating a semiconductor device according to various aspects of the present disclosure.

Referring to FIG. 6, illustrated is a flowchart of a third embodiment 600 for fabricating a semiconductor device. The method 600 begins with block 602 in which a substrate is provided. The method 600 continues with block 604 in which pad oxide layers may be formed over a frontside and a backside of the substrate. The method 600 continues with block 606 in which hardmask layers may be formed over the pad oxide layers on the frontside and the backside of the substrate. The method 600 continues with block 608 in which a trench may be formed in the frontside of the substrate. The method 600 continues with block 610 in which a dielectric layer may be formed to cover entire surface and fill the trench. The method 600 continues with block 612 in which sacrificial oxide layers may be formed over the dielectric on the frontside of the substrate and the hardmask layer in the backside of the substrate. The discussion that follows illustrates a semiconductor device that can be fabricated according to the method 600 of FIG. 6.

Figure 7A:
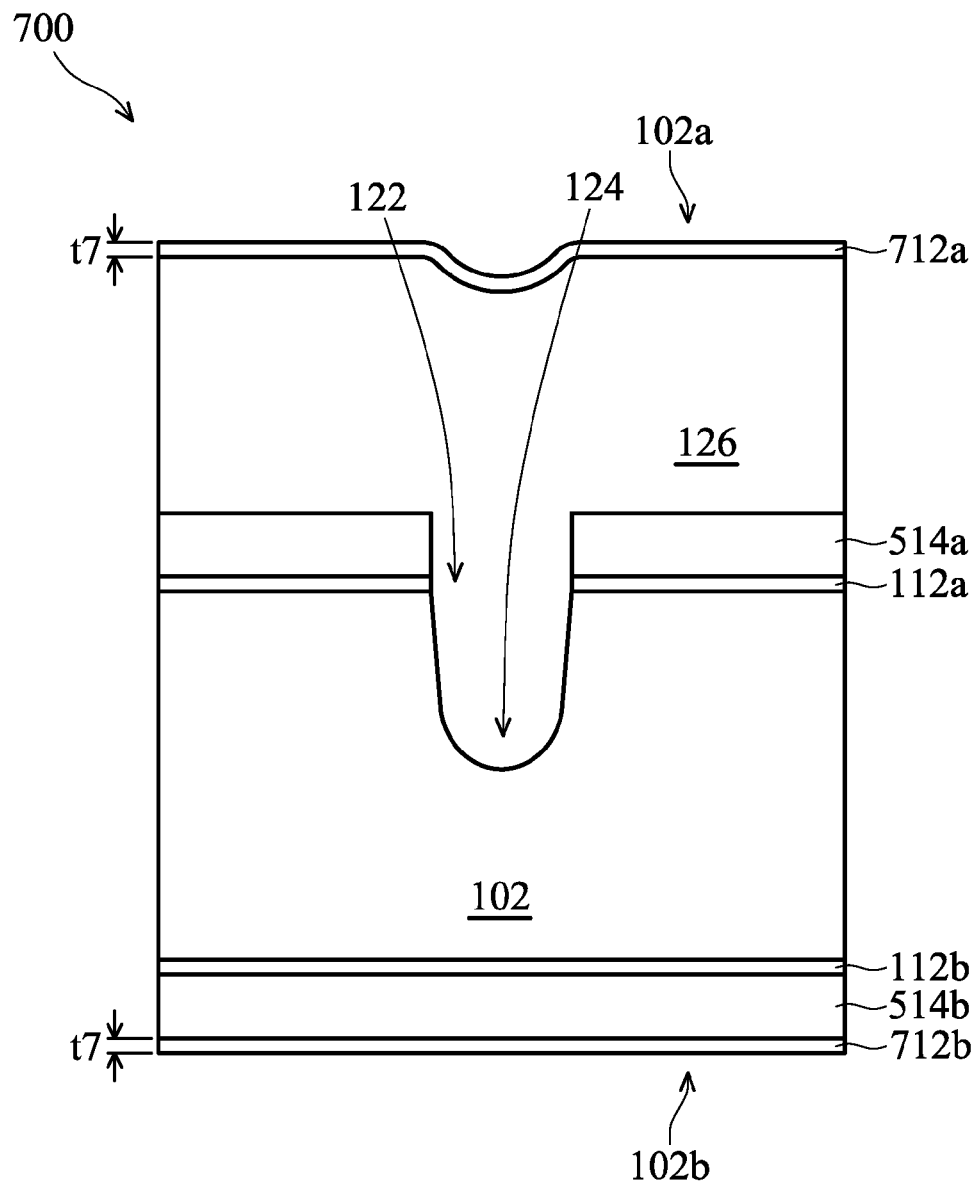
FIGS. 7A-B show cross-sectional views of a semiconductor device at various stages of fabrication according to an embodiment.
Figure 7B:
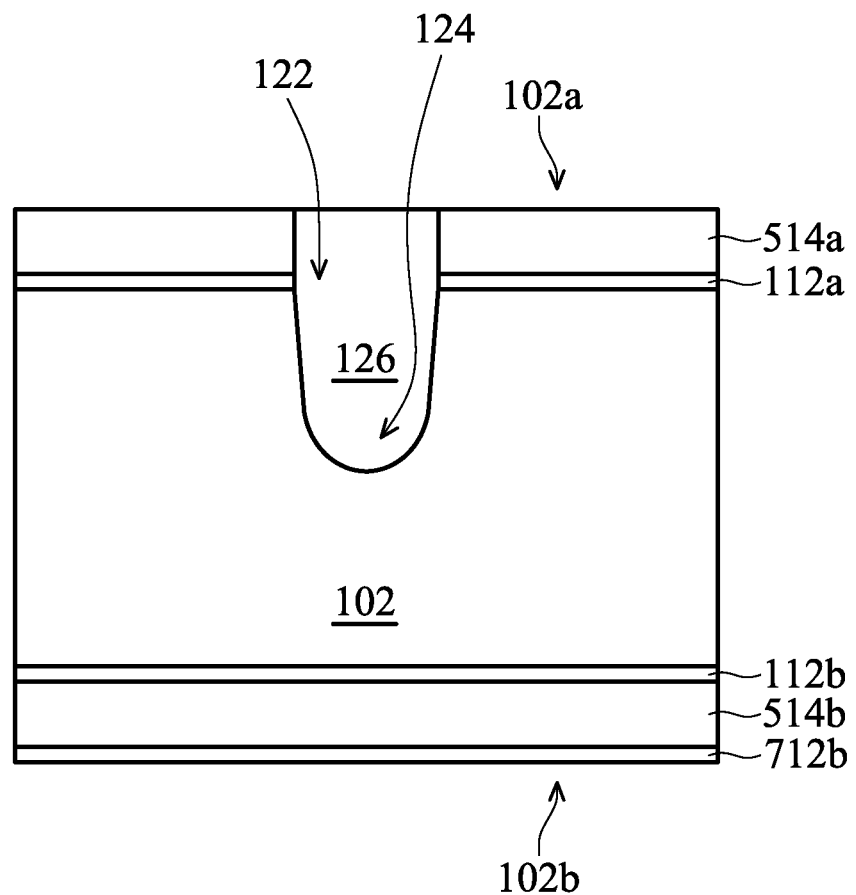

Referring to FIGS. 7A-7B, illustrated are cross-sectional views of a portion of a semiconductor device 700 at various stages of fabrication according to the embodiment of FIG. 6. It is noted that the method 600 of FIG. 6 does not produce a completed semiconductor device. In some embodiments, a completed semiconductor device may be fabricated using complementary metal-oxide-semiconductor (CMOS) technology processing. Accordingly, it is understood that additional processes may be provided before, during, and after the method 600 of FIG. 6, and that some other processes may only be briefly described herein. Further, the portion of semiconductor device 700 is similar to the portions of the semiconductor devices 300, 500 of FIGS. 3 and 5. Accordingly, similar feature in FIGS. 3, 5, and 7 are numbered the same for the sake of clarity and simplicity.

Referring to FIG. 7A, the potion of the semiconductor device 700 comprises a substrate 102. The fabrication processes of the embodiment in FIG. 7A are substantially similar to the fabrication processes described with reference to FIG. 5A except for the formation of additional sacrificial oxide layers. In some embodiments, the semiconductor device 700 may comprise pad oxide layers 112a, 112b over a frontside 102a and a backside 102b of the substrate 102. Hardmask layers 514a, 514b, for example a silicon nitride, may be formed over the pad oxide layers 112a, 112b on the frontside 102a and the backside 102b of the substrate 102. And the subsequent fabrication processes of the embodiment are substantially similar to the fabrication processes described with reference to FIGS. 3C-3D. Namely, forming an opening 122 in the hardmask layer 514a and the pad oxide layer 112a on the frontside 102a of the substrate 102; performing anisotropic etching to form a trench 124 in the substrate 102 on the frontside 102a; and filling the trench 124 with a dielectric layer 126 that also covers the entire frontside 102a of the substrate 102.

Still referring to FIG. 7A, sacrificial oxide layers 712a, 212b are further formed over the dielectric layer 126 on the frontside 102a of the substrate 102 and the hardmask layer 514b on the backside 102b of the substrate 102. In some embodiments, the sacrificial oxide layers 712a, 712b can be deposited using a CVD process. For example, the sacrificial oxide layers 712a, 712b can be deposited under a pressure less than 10 mTorr and a temperature of about 350° C. to 500° C., using silane ($SiH_4$) and $N_2O$ as reacting precursors. The sacrificial oxide layers 712a, 712b may have any suitable thickness. In the present embodiment, a thickness t7 of the sacrificial oxide layers 712a, 712b may be in the range of about 80 to 100 angstroms.

Referring to FIG. 7B, subsequent to the sacrificial oxide layer 712a, 712b deposition process, a CMP may be performed to remove the sacrificial oxide layer 712a and a top portion of the dielectric layer 126 above the hardmask layer 514a to expose the hardmask layer 514a on the frontside 102a of the substrate 102, thereby leaving the dielectric layer 126 filling the opening 122 and trench 124. It should be noted that structure of FIG. 7B is substantially same as the structure of FIG. 5C. Accordingly, the subsequent fabrication processes of the embodiment are substantially similar to the fabrication processes described with reference to FIGS. 5D-5E. Namely, the hardmask layer 514a has been removed by a wet chemical etching process, for example, by dipping the substrate 102 in hot phosphoric acid ($H_3PO_4$), exposing a top surface of the pad oxide layer 112a on the frontside 102a of the substrate 102. Because the wet chemical etching process has higher etch selectivity for nitride than to oxide, the etch process removes the hardmask layer 514a faster than the dielectric layer 126 and the sacrificial oxide layer 712b over the hardmask layer 514b on the backside 102b of the substrate 102. Accordingly, the silicon oxide layer 126 extends over a top surface of the pad oxide layer 112a on the frontside 102a of the substrate 102. Further, a substantial portion of the sacrificial oxide layer 712b over the hardmask layer 514b on the backside 102b of the substrate 102 remains.

And then, the pad oxide layer 112a and sacrificial oxide layer 712b have been removed by a wet etching process simultaneously, for example, by dipping the substrate 102 in hydrofluoric acid (HF), exposing the top surface of the substrate 102. Additionally, because the wet chemical etching process has higher etch selectivity for oxide than to nitride, the etch process removes the pad oxide layer 112a and sacrificial oxide layer 712b faster than the hardmask layer 514b. Accordingly, a substantial portion of the hardmask layer 514b may remain on the backside 102b of the substrate 102. Accordingly, applicant's method of fabricating a semiconductor device 700 may reserve the hardmask layer 514b on the backside 102b of the substrate 102 to serve as carrier transportation stops during subsequent plasma-related processes thereby protecting the semiconductor device 700.

Figure 8:
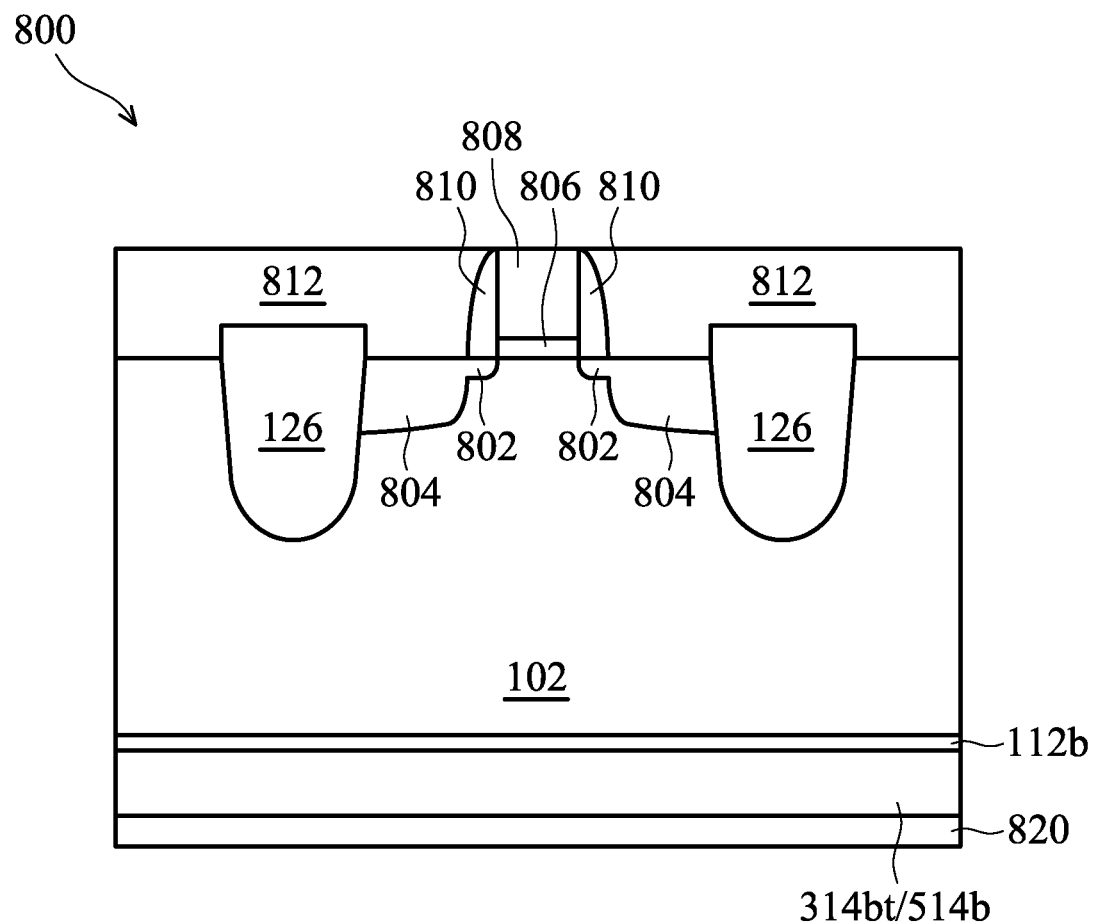
FIG. 8 is a cross-sectional view of a semiconductor device fabricated in accordance with an embodiment of the invention.

Referring to FIG. 8, illustrated is a cross-sectional view of a semiconductor device 800 fabricated using any one of the previous described embodiment. The semiconductor device 800 such as a metal-oxide-semiconductor (MOS) transistor can be formed over a portion of the substrate 102 adjacent to the trench 124. Fabrication of the MOS transistor 800 is well known to those skilled in the art and is thus not described here, for brevity. The MOS transistor 800 now comprises lightly doped source and drain (LDD) regions 802 and source/drain regions 804 formed in a portion of the substrate 102, a gate stack comprised of a gate dielectric layer 806 and a gate electrode 808 sequentially formed over the substrate 102, spacers 810 respectively formed on both sidewalls of the gate stack, and an interlayer dielectric (ILD) layers 812 surrounding the spacers 810. In some embodiment, the semiconductor device comprises a gate with a gate length less than 32 nm.

Still referring to FIG. 8, the pad oxide layer 112b and hardmask layer 314bt or 514b may be kept in the backside 102b of the substrate 102. In some embodiments, an additional layer 820, such as a poly-silicon layer or a dielectric layer, may also be formed to adjoin to the hardmask layer 314bt or 514b during subsequent processes. In some embodiments, the substrate 102 may be thinned to remove the additional layer 820, hardmask layer 314bt or 514b, pad oxide layer 112b, and/or part of the substrate 102 for subsequent package processes.

In some embodiments, the gate dielectric layer 806 may comprise silicon oxide, silicon oxynitride, high-k dielectric layer, or combination thereof. In some embodiments, the high-k dielectric layer may comprise hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the gate dielectric layer 806 may further comprise an interfacial layer to reduce damages between the gate dielectric layer 806 and the substrate 102. In one embodiment, the interfacial layer may comprise silicon oxide.

In some embodiments, the gate electrode 808 may comprise a polysilicon gate and a metal gate. In some embodiments, the metal gate may comprise one or more layers including Ti, TiN, TaN, Ta, TaC, TaSiN, W, WN, MoN, MoON, $RuO_2$, and/or other suitable materials. The metal gate may comprise one or more layers formed by PVD, CVD, ALD, plating, and/or other suitable processes. The metal gate may be formed by a gate-first or a gate-last metal gate fabrication process.

While the exemplary embodiments have been described, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements. The invention can be used to form or fabricate a semiconductor device. In this way, the hardmask layer in the backside of the substrate may be reserved to serve as carrier transportation stops during subsequent plasma-related processes thereby protecting the semiconductor device.

What is claimed is:

1. A method for fabricating a semiconductor device, comprising:
   forming pad oxide layers over a frontside and a backside of a substrate;
   forming hardmask layers over the pad oxide layers on the frontside and the backside of the substrate;
   forming sacrificial oxide layers over the hardmask layers on the frontside and the backside of the substrate;
   removing one of the sacrificial oxide layers over one of the hardmask layers on the frontside of the substrate;
   performing a chemical mechanical polishing to remove one of the sacrificial oxide layers and a top portion of a dielectric layer on the frontside of the substrate;
   removing one of the hardmask layers over one of the pad oxide layers on the frontside of the substrate, whereby one of the hardmask layers over one of the pad oxide layers on the backside of the substrate is protected by one of the sacrificial oxide layers on the backside of the substrate; and
   removing one of the pad oxide layers on the frontside of the substrate and one of the sacrificial oxide layers on the backside of the substrate simultaneously by wet etching.

2. The method of claim 1, where the step of removing one of the sacrificial oxide layers over one of the hardmask layers on the frontside of the substrate is performed using a dry etching process.

3. The method of claim 1, wherein a thickness of one of the pad oxide layers is in the range of about 80 to 100 angstroms.

4. The method of claim 1, wherein the hardmask layers comprise silicon nitride.

5. The method of claim 1, wherein a thickness of one of the hardmask layers is in the range of about 700 to 900 angstroms.

6. A method for fabricating a semiconductor device, comprising:
   forming pad oxide layers over a frontside and a backside of a substrate;
   forming hardmask layers over the pad oxide layers on the frontside and the backside of the substrate;
   forming a trench in the frontside of the substrate;
   filling the trench with a dielectric layer that also covers the entire frontside of the substrate; and
   forming sacrificial oxide layers over the dielectric layer on the frontside of the substrate and the hardmask layer in the backside of the substrate;
   performing a chemical mechanical polishing to remove one of the sacrificial oxide layers and a top portion of the dielectric layer on the frontside of the substrate;
   removing one of the hardmask layers over one of the pad oxide layers on the frontside of the substrate, whereby one of the hardmask layers over one of the pad oxide layers on the backside of the substrate is protected by one of the sacrificial oxide layers on the backside of the substrate; and
   removing one of the pad oxide layers on the frontside of the substrate and one of the sacrificial oxide layers on the backside of the substrate simultaneously by wet etching.

7. The method of claim 6, where the step of removing one of the hardmask layers over one of the pad oxide layers on the frontside of the substrate is performed using a wet etching process.

8. The method of claim 6 further comprising forming the semiconductor device over a portion of the frontside of the substrate adjacent to the trench, wherein the semiconductor device comprises a gate with a gate length less than 32 nm.

9. The method of claim 6, wherein the hardmask layers comprise silicon nitride.

10. The method of claim 6, wherein a thickness one of the hardmask layers is in the range of about 700 to 900 angstroms.

* * * * *